United States Patent [19]

Ohshima et al.

[11] Patent Number: 5,194,929
[45] Date of Patent: Mar. 16, 1993

[54] NONVOLATILE SEMICONDUCTOR MEMORY AND A MEMORY OF MANUFACTURING THE SAME

[75] Inventors: Yoichi Ohshima, Yokohama; Masaki Sato, Kawasaki, both of Japan

[73] Assignee: Kabushiki Kaisha Toshiba, Kawasaki, Japan

[21] Appl. No.: 837,087

[22] Filed: Feb. 10, 1992

Related U.S. Application Data

[63] Continuation of Ser. No. 611,482, Nov. 9, 1990, abandoned, which is a continuation of Ser. No. 330,659, Mar. 30, 1989, abandoned.

[30] Foreign Application Priority Data

Mar. 31, 1988 [JP] Japan .................................. 63-78980

[51] Int. Cl.$^5$ ...................... H01L 29/68; H01L 29/78; H01L 29/06; H01L 23/48
[52] U.S. Cl. .................................. 257/326; 257/637; 257/644; 257/754
[58] Field of Search .................... 357/23.5, 59, 54, 67, 357/90, 71, 23.9, 23.14; 365/185

[56] References Cited

U.S. PATENT DOCUMENTS

| | | | |
|---|---|---|---|
| 3,740,835 | 6/1073 | Duncan | 357/67 |
| 4,092,661 | 5/1987 | Watrous, Jr. | 357/90 |
| 4,169,270 | 9/1979 | Hayes | 357/54 |
| 4,707,457 | 11/1987 | Erb | 357/71 |
| 4,748,492 | 5/1988 | Iwase et al. | 357/54 |
| 4,753,709 | 6/1988 | Welch et al. | 357/59 |
| 4,788,663 | 11/1988 | Tanaka et al. | 337/23.5 |
| 4,918,502 | 7/1990 | Komori et al. | 357/23.5 |
| 4,929,988 | 5/1990 | Yoshikawa | 357/23.5 |

FOREIGN PATENT DOCUMENTS 61-24282 2/1986 Japan .................................. 357/23/5

OTHER PUBLICATIONS

IBM Technical Disclosure Bulletin, "Self-Aligned, Borderless Contact with Nitride Layer", vol. 30 No. 8 (Jan. 1988) pp. 86-87.

B. Roessler et al. "Erasable and Electrically Reprogrammable Read-only Memory Using the N Schomml SIMOS One Transistor Cell", Siemens Forsch.-u. Entwickl.-Ber. Bd. 4 (1975) Nr. 6, pp. 345-351.

Primary Examiner—J. Carroll
Attorney, Agent, or Firm—Finnegan, Henderson, Farabow, Garrett and Dunner

[57] ABSTRACT

In a semiconductor integrated circuit comprising an array of memory cells of floating gate type MOS transistors, an insulating film is formed on the top surface and the side walls of the gate electrode portion. The insulating films on the side walls serve as an offset region of a channel contacting with the drain region. The side end portions of the drain region, contacting the channel region has a lower impurity concentration than the remaining portion of the drain region. A conductive layer covers the surface of the drain region and at least the insulating films on the side walls of the gate electrode, which upstands above both ends of the drain region. A metal interconnection layer is deposited on the conductive layer. In a method of manufacturing a semiconductor integrated circuit, an array of memory cells each comprising a floating gate type MOS transistor is formed on a semiconductor substrate, insulating films are fomred on the top surface and the side walls of a gate electrode portion located above both ends of a drain region of the transistor. A conductive film covering the surface of the drain region and at least the insulating films is formed on the side walls of the gate electrode located above both ends of the drain region. An interlayer insulating film is formed over the entire major surface of the structure. A contact hole is formed by selectively etching the interlayer insulating film with a stopper of the conductive film. Finally a metal interconnection pattern is formed on the substrate containing the contact hole.

3 Claims, 8 Drawing Sheets

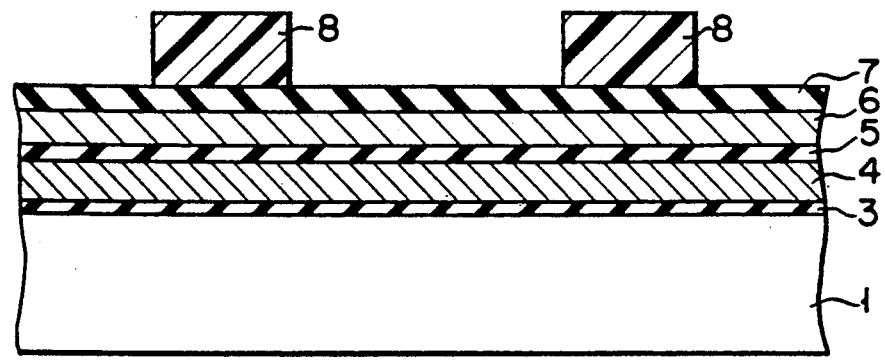
F I G. 3A
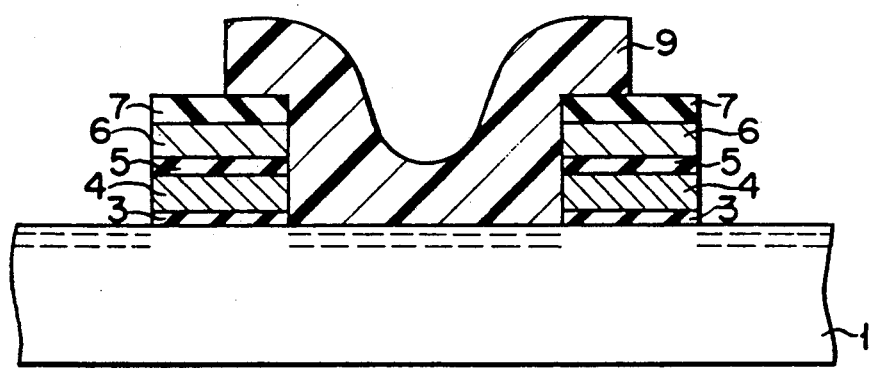
F I G. 3B
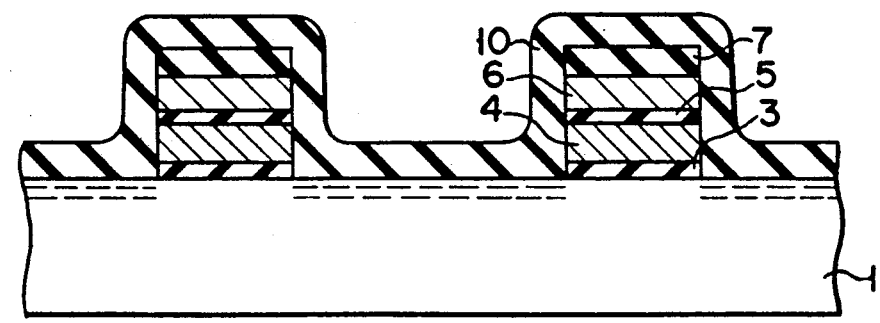
F I G. 3C

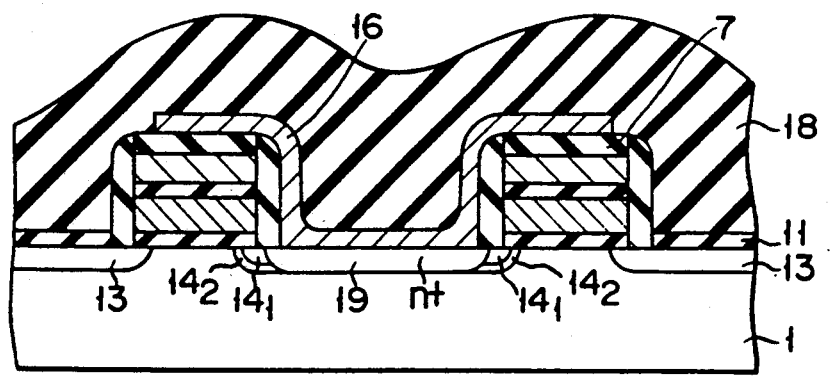
F I G. 3G
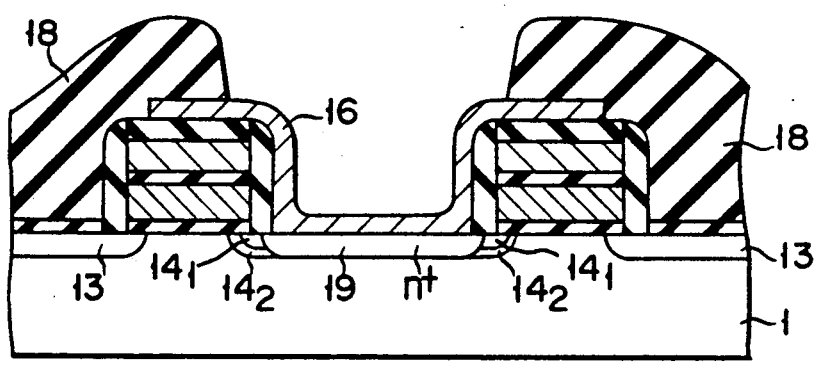
F I G. 3H
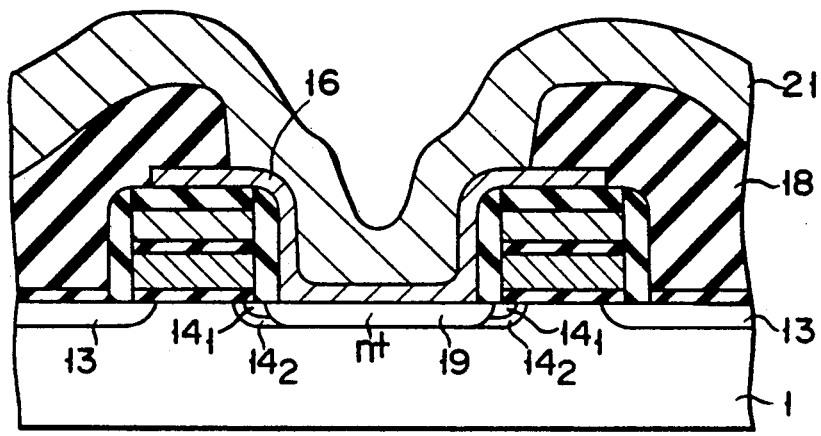
F I G. 3I

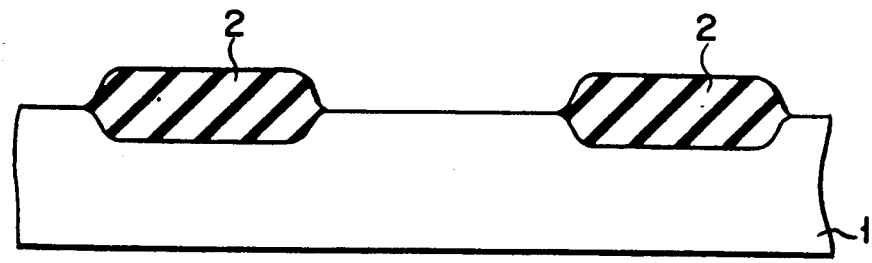
F I G. 4A
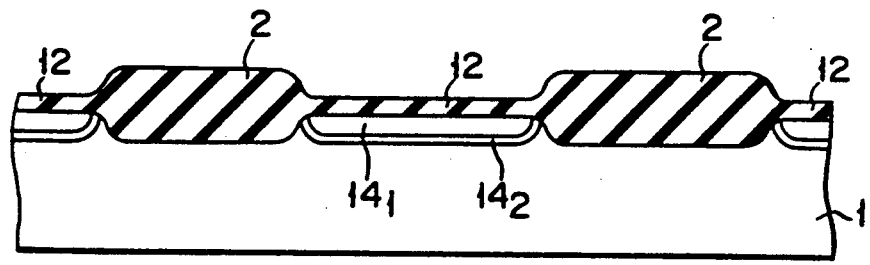
F I G. 4B
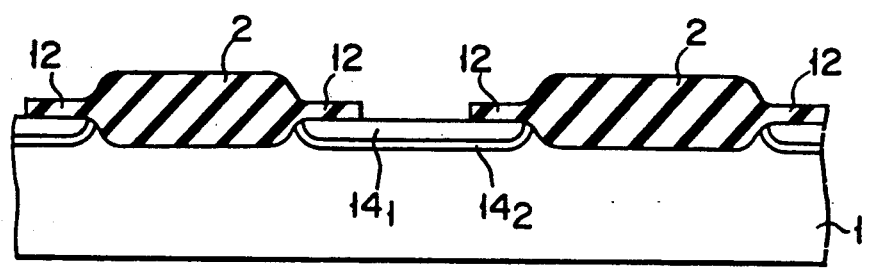
F I G. 4C
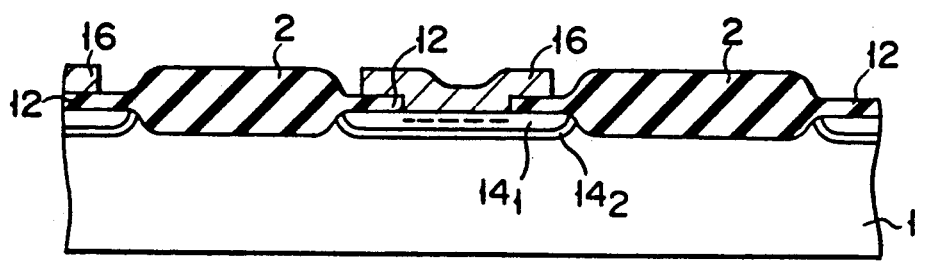
F I G. 4D

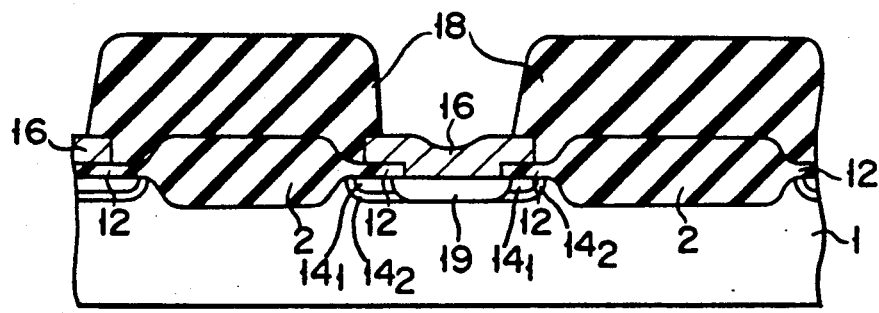
F I G. 4E
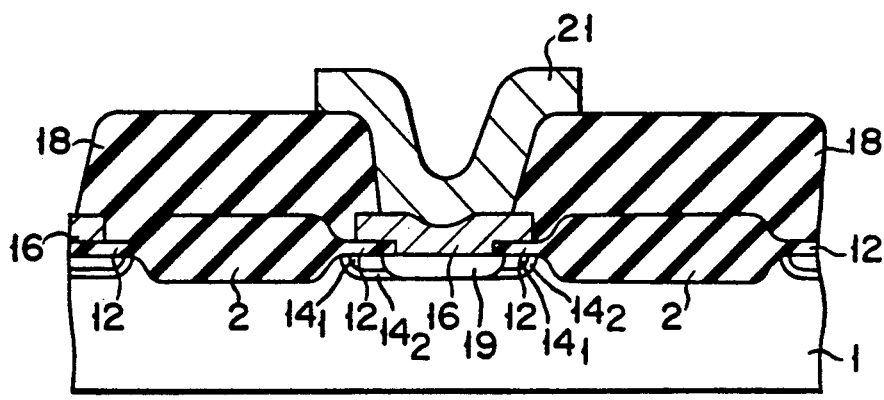
F I G. 4F
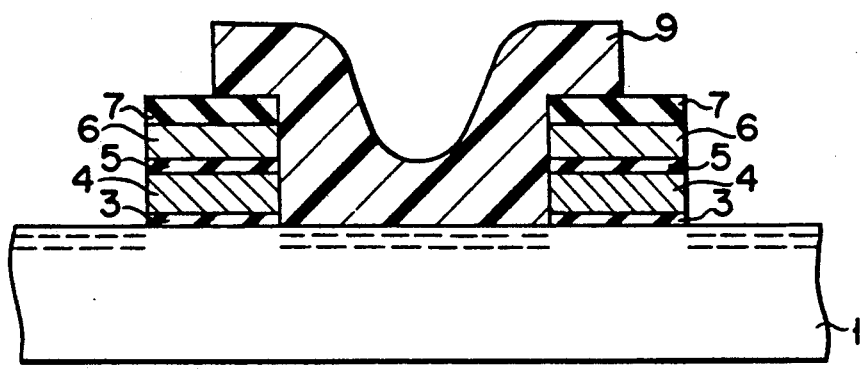
F I G. 5A

NONVOLATILE SEMICONDUCTOR MEMORY AND A MEMORY OF MANUFACTURING THE SAME

This application is a continuation of application Ser. No. 07/611,482, filed Nov. 9, 1990, abandoned, which is a continuation of application Ser. No. 07/330,659, filed Mar. 30, 1989, abandoned.

BACKGROUND OF THE INVENTION

1. Field of the Invention

The present invention relates to a nonvolatile semiconductor memory and a method of manufacturing the same, and more particularly to a floating gate memory cell and a method of manufacturing the same.

2. Description of the Related Art

In the nonvolatile semiconductor memory, such as an EPROM (erasable programmable read only memory) of the ultraviolet rays erasing type and an EEPROM (electrically erasable read only memory), floating gate type MOS transistors are used for the memory cells. The memory cells of the EPROM using a p-type silicon substrate are manufactured through a manufacturing process as shown in FIGS. 1A through 1D. As shown in FIG. 1A, a field insulating film (not shown) is first formed on the surface of p-type silicon substrate 51 by a known process, for the element isolation defining element formed areas. A gate insulating film 52 is then formed on the surface of the substrate 51. A first polycrystalline silicon layer 53 is deposited over the enter entire surface of the insulating film. Thereafter, a silicon oxide film 54 is formed on the polycrystalline silicon layer 53. Subsequently, a second polycrystalline silicon layer 55 is deposited over the entire surface of the silicon oxide film. A resist pattern 71 for transistor formation is formed on the second polycrystalline silicon layer.

As shown in FIG. 1B, the second polycrystalline silicon layer 55, silicon oxide film 54, first polycrystalline silicon layer 53, and gate insulating film 52 are successively and selectively etched to form cell transistor regions, a control gate electrode 55, and a floating gate electrode 53, by using the resist pattern 71 as a mask. Thereafter, using the control gate electrode 55 as a mask, an n-type impurity is ion implanted into the substrate 51. Subsequently, a silicon oxide film 56 is formed on the surface of the transistor region including the control electrode 55 and the floating gate electrode 53, by thermal oxidizing process. In this case, an n+ diffusion layer to be a source region 57 and a drain region 58 is also formed simultaneously.

Then, a CVD (chemical vapor growth deposition) oxide film as an interlayer insulating film 59 is deposited over the entire surface of the structure by chemical vapor growth deposition (CVD) process. The entire surface of the structure is coated with a resist 60. The resist 60 is patterned. Using the formed resist pattern as a mask, the CVD oxide film 59 is etched to open a contact hole 61 above the drain region 58. As shown in FIG. 1C, a reactive ion etching process (RIE) is applied to the structure, to remove the insulating oxide film 56 on the bottom surface of the contact hole. Then, the resist 60 is removed. Aluminum is deposited over the entire major surface of the structure, to form an aluminum film. Then, its entire surface is coated with resist. The resist is patterned while referring to the contact hole. By using the resultant resist pattern as a mask, the aluminum film is selectively etched away to form an aluminum interconnection pattern 62.

After, an interlayer insulating film and pads are formed on the aluminum interconnection pattern by the ordinary IC manufacturing process, to complete an EPROM integrated circuit.

However, the EPROM cells thus formed have the following disadvantages.

In the above manufacturing method, a satisfactory amount of the tolerance for the mask alignment is required for opening the contact hole 61. Otherwise, poor insulation may be set up between the gate electrodes 53 and 55, and the aluminum interconnection pattern 62. Further, the microfabrication and high density of integration of electronic elements are essential factors for cost reduction of the resultant integrated circuits. In this respect, the tolerance for the mask alignment is important. The above manufacturing method requires a fixed amount of tolerance that is determined by the accuracy of an exposing system used.

Further, according to the above method, an oxide film is naturally formed on the bottom surface of the contact hole during a period from the opening of the contact hole 61 until the formation of the aluminum interconnection pattern 62. The naturally grown oxide film degrades an electrical connection between the aluminum interconnection layer and the drain region, resulting in an increase of the contact resistance at the contact portion.

In the EPROM, when the charge stored in the floating gate electrode varies by $\Delta Q$, a change of the threshold voltage of the memory cell occurs; the change is given by $\Delta V th = \Delta Q/C$, where C is a capacitance between the control electrode and the floating gate electrode. The change provides a discrimination of "0" from "1" and vice versa.

If movable ions such as Na+ ions enter the silicon oxide film in the periphery of the floating gate electrode, the amount of the stored charge in the floating gate electrode apparently decreases. Accordingly, the threshold voltage varies, degrading the reliability of the memory cell. It was confirmed that with progression of the microfabrication of the cells, a charge change $\Delta Q$ one by several the conventional charge change produces 0.5 or more of the threshold variation. Such movable ions such as Na+ ion attach to the side wall and the bottom surface of the contact hole, and most of the movable ions is contained in the interconnection material (aluminum) 63 deposited thereon. The movable ions enter the cell from an interface between the aluminum interconnection portion 62 in the contact hole 61 and the CVD insulating film 59 and through the silicon oxide film portion 56 formed between the CVD insulating film 9 and the n+ diffusion layers 57 and 58 in the surface region of the silicon substrate. The entered movable ions shift the threshold value Vth, possibly causing soft error, and hence degradation of the cell reliability. The above fact was confirmed by us.

If a further microfabrication of the memory allows the scalling of 1/K element size and K times impurity concentration, the power voltage cannot be reduced to 1/K. In this case, an intensity of a peak electric field in the drain depletion layer becomes excessive, and the hot carriers generated increases. In the n-channel EPROM cell, to write data, by applying a high voltage to the control gate electrode, a high voltage is applied to the drain, causing hot carriers, and those hot carriers are injected into the floating gate electrode. To read out data, by applying an ordinary power voltage to the control gate electrode, the voltage applied to the drain is controlled to such a voltage preventing generation of hot electrons. A difference between the threshold voltages provides a discrimination of "0" from "1" of the read data. With microfabrication progression, the hot electrons tend to occur. Under this condition, unexpected electrons are possibly injected into the floating gate electrode, so that the soft error tends to occur and the reliability of the cells is degraded.

SUMMARY OF THE INVENTION

As described above, the conventional memory cells have such a structure that the aluminum interconnection layer and the drain region contact with each other in the contact hole opened in the CVD insulating film on the surface of the drain region. This structure requires a large tolerance for the pattern alignment o the gate electrode with the contact hole, making a further microfabrication of the memory cells difficult. The movable ions contained in the aluminum interconnection layers tend to enter the memory cells, leading to poor reliability of the cells.

Accordingly, an object of the present invention is to provide a semiconductor integrated circuit having nonvolatile memory cells which requires a reduced tolerance for the pattern alignment of the gate electrodes with the contact hole, and hence allows a further microfabrication of the memory cells, prevents the entering of the movable ions into the memory cells, and removes the degradation of the reliability of the memory cells.

In the method of manufacturing conventional memory cells, the aluminum interconnection layer and the drain region contact with each other in the contact hole opened in the CVD insulating film on the surface of the drain region. This method requires a large tolerance for the pattern alignment of the gate electrode with the contact hole, making a further microfabrication of the memory cells difficult. The movable ions contained in the aluminum interconnection layers tend to enter the memory cells, leading to poor reliability of the cells.

Accordingly, another object of the present invention is to provide a method of manufacturing a semiconductor integrated circuit having nonvolatile memory cells which requires a reduced tolerance for the pattern alignment of the gate electrodes with the contact hole, and hence allows a further microfabrication of the memory cells, suppresses the growth of natural oxide on the surface of the contact hole, prevents the entering of the movable ions into the memory cells, and removes the degradation of the reliability of the memory cells.

A semiconductor integrated circuit according to the present invention has an array of memory cells each comprising a floating gate type MOS transistor whose source and drain regions are formed on a semiconductor substrate in self alignment with a laminated structure pattern containing a floating gate electrode and a control gate electrode. An insulating film is formed on the top surface and the side walls of the gate electrode portion. The side end portions of the drain region, contacting the channel region has a lower impurity concentration than the remaining portion of the drain region. A conductive layer covers the surface of the drain region and at least the insulating films on the side walls of the gate electrode, which upstands above both ends of the drain region. A metal interconnection layer is deposited on the conductive layer.

The insulating films on the side walls of the gate electrode may have a laminated structure consisting of only a PSG film or the combination of a PSG film and a thermal oxide film.

A method of manufacturing a semiconductor integrated circuit according to the present invention comprises the steps of: forming on a semiconductor substrate an array of memory cells each comprising a floating gate type MOS transistor; forming insulating films on the top surface and the side walls of a gate electrode portion located above both ends of a drain region of the transistor; removing an insulating film on the surface of the drain region; forming a conductive film covering the surface of the drain region and at least the insulating films on the side walls of the gate electrode located above both ends of the drain region; forming an interconnection layer over the entire major surface of the structure; forming a contact hole by selectively etching said interlayer insulating film with a stopper of said conductive film; and forming a metal interconnection pattern on said substrate containing said contact hole.

When forming the conductive film, a mask alignment is allowed while referenced to the gate electrode portion.

The floating gate type memory cell thus arrange has an (lightly doped drain) LDD structure. It relieves a peak electric field generated in the vicinity of the drain junction, and holds back generation of hot electrons. The contact portion may be formed in a self alignment manner, with a reduced tolerance of the mask alignment. This ensures a further microfabrication and a higher density of integration. If the PSG insulating film is used for the insulating films on the side walls of the gate electrode portion, the entering of movable ions mainly contained in the metal interconnection layer into the memory cell is minimized, improving the cell reliability.

According to the manufacturing method as mentioned above, a conductive film is formed on the surface of the drain region before the contact hole is opened. Therefore, no oxide film naturally grows on the surface of the drain region during a period of opening of the contact hole until the formation of the interconnection pattern. Thus, a good electrical connection in the contact portion is secured. Subsequent to the formation of the conductive film, it can be prevented for external movable ions from entering the memory cell. This makes the cell reliability free from a variation of the threshold voltage of the cell. Since, also the metal interconnection pattern contacts the conductive film by the self alignment formation, a tolerance for the mask alignment is reduced, and a further microfabrication of the memory cells is provided.

BRIEF DESCRIPTION OF THE DRAWINGS

FIGS. 3A through 3I are sectional views taken on line X—X' in FIGS. 2A through 2E;

FIGS. 4A through 4F are sectional views taken on line Y—Y' in FIGS. 2A through 2E; and FIGS. 5A through 5D are sectional views showing a semiconductor structure of an EPROM according to an embodiment of the present invention, which show a sequence of steps of manufacturing process.

DETAILED DESCRIPTION OF THE PREFERRED EMBODIMENTS

A semiconductor integrated circuit and a method of manufacturing the same according to the present invention will be described with reference to the accompanying drawings.

FIGS. 2A through 2E show plan views of several patterns for explaining a sequence of process steps for manufacturing an EPROM according to an embodiment of the present invention. FIGS. 3A through 3I, and FIGS. 4A through 4F are sectional views of the EPROM taken on line X—X' and Y—Y' in FIG. 2E and shows sectional structures of the EPROM in the respective process steps.

Figure 1A:
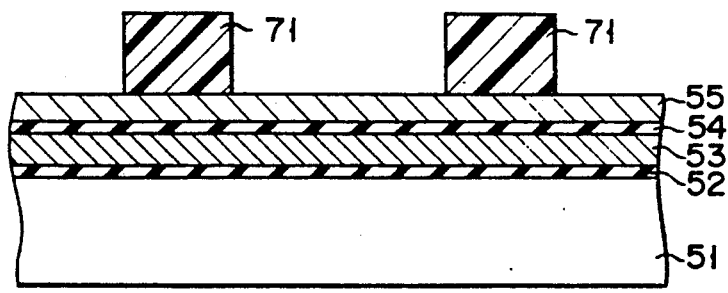
FIGS. 1A through 1D are sectional views of a semiconductor structure of a conventional EPROM, which show a sequence of steps of manufacturing process.
Figure 1B:
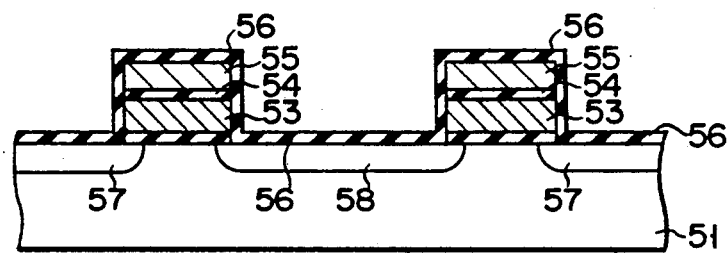
Figure 1C:
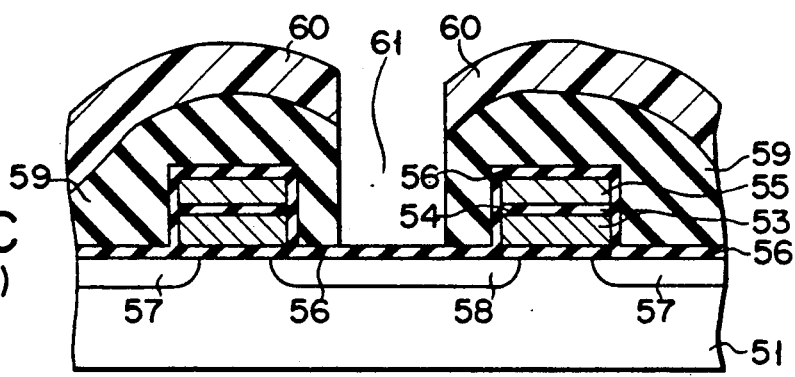
Figure 1D:
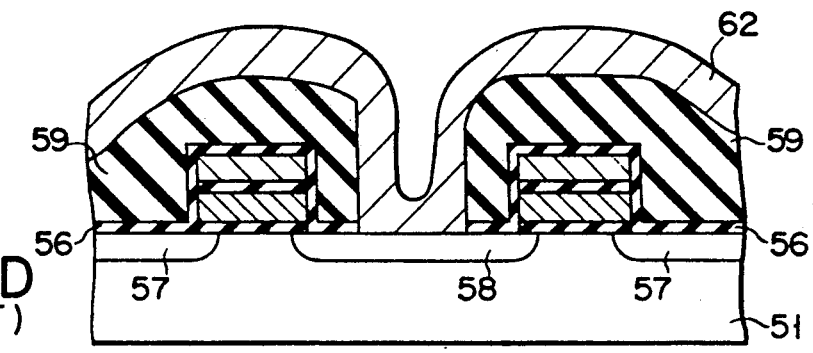
Figure 2A:
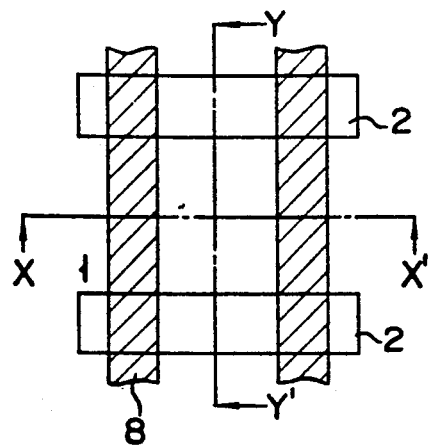
FIGS. 2A through 2E are plan views showing a semiconductor structure of an EPROM according to an embodiment of the present invention, which show a sequence of steps of manufacturing process.

As shown in FIGS. 2A, 3A and 4A, a field insulating film 2 is first formed on the surface of p-type silicon substrate 1 by the known process, for the element isolation defining element formed areas. A gate insulating film 3 of approximately 200 Angstroms thick is then formed on the surface of the substrate 1 by thermal oxide process. A first polycrystaline silicon layer 4 of 4000 Angstroms thick is deposited over the entire surface of the field insulating film 2 and the insulating film 3 by vapor growth process, for example. Thereafter, the first polycrystalline silicon layer 4 is doped with an impurity such as phosphorus. For the doping, ion implantation may be used. If necessary, the thermal diffusion process may be used using a diffusion source of $POCl_3$. A silicon oxide film 5 of approximately 350 Angstroms is formed on the polycrystalline silicon layer 4 by an oxidizing process at 900° to 1000° C., for example. Subsequently, a second polycrystalline silicon layer 6 is deposited over the entire surface of the silicon oxide film by, for example, the vapor growth process. The formed second polycrystalline silicon layer 6 is doped with phosphorus as an impurity. Further, silicate glass containing phosphorus (e.g., PSG layer 7) is deposited over the entire surface of the second polycrystalline silicon layer 6. A resist pattern 8 is additionally formed over the PSG layer 7.

Figure 2B:
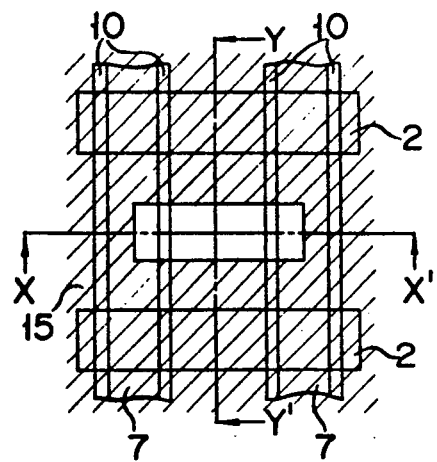

As shown in FIGS. 2B, 3B and 4B, the PSG layer 7, second polycrystalline silicon layer 6, silicon oxide film 5, first polycrystalline silicon layer 4, and gate insulating film 3 are successively and selectively etched to form cell transistor regions and gate electrode regions. For the etching, the anisotropy etching process is employed, and the resist pattern 8 is used as a mask. The resist pattern 8 is removed. Low concentration impurity regions ($n^-$ regions) are to be formed in the drain regions. To this end, phosphorus is ion implanted into the entire surface region of the structure. The ion implantation is performed under the condition of 120 KeV of acceleration voltage and $1 \times 10^{13}$ cm$^{-2}$ of dosage. Additionally, arsenic is doped into the surface region of the substrate 1 under the condition of 40 KeV of acceleration voltage and $1 \times 10^{14}$ cm$^{-2}$ of dosage. Subsequent to this the drain region is covered with a resist 9. Arsenic is doped into the source region under the condition of 40 KeV and $1 \times 10^{15}$ cm$^{-2}$.

Figure 3D:
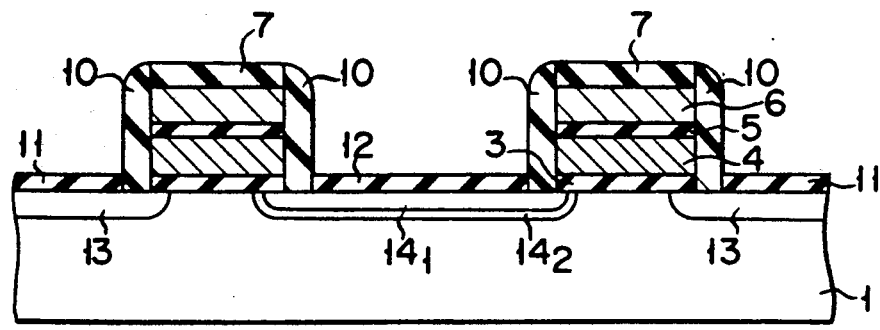

After the resist 9 is removed, a layer 10 of PSG, for example, is deposited over the entire surface of the structure, as shown in FIG. 3C. As shown in FIG. 3D, the PSG layer 10 except PSG side walls 10 in the electrode portion is selectively etched by a reactive ion etching (RIE) method. Thereafter, silicon oxide films 11 and 12 are formed on the surface of the source and drain regions of the substrate 1, by a thermal oxidizing method. In the above process step, the arsenic doped by the ion implantation is diffused, so that a high concentration impurity region ($n^+$ region) is formed in a source region and a low concentration impurity region (double $n^-$ region) is formed in a drain region.

Figure 2C:
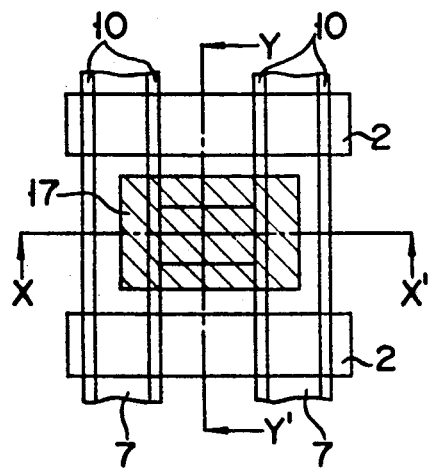
Figure 3E:
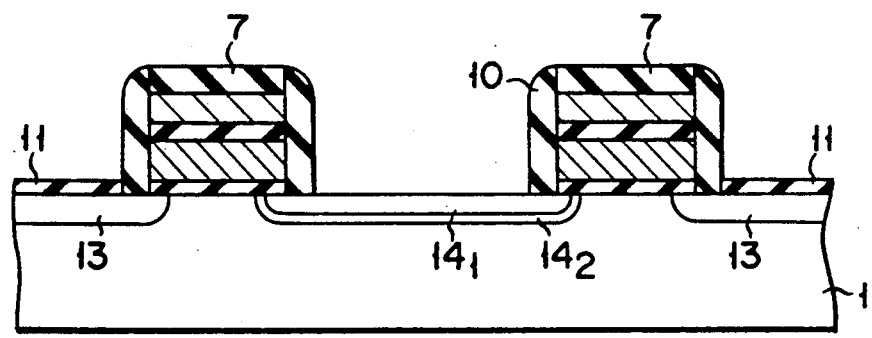
Figure 3F:
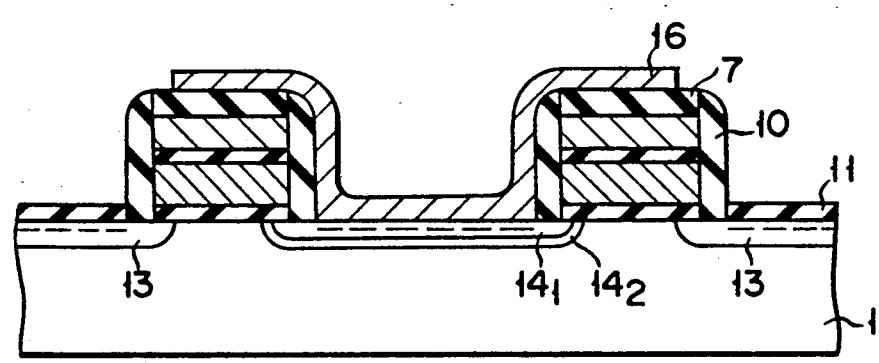

The surface of the structure is coated with resist to form a resist layer 15 over its surface (FIG. 2B). The formed resist layer 15 is patterned with a mask pattern, while referenced to the field insulating film 2, as shown in FIG. 2B. By using the formed resist pattern as a mask, a silicon oxide film 12 on a drain region is etched as shown in FIGS. 3E and 4C. Subsequently, a third polycrystalline silicon layer of several hundred Angstroms is deposited over the entire surface of the structure. Following this, to dope the third polycrystalline silicon layer with an impurity and to form a high concentration impurity region ($n^+$ region) in the drain region $14_1$ arsenic is doped into the structure at 150 KeV of acceleration voltage and $1 \times 10^{15}$ cm$^{-2}$ of dosage. As shown in FIG. 2C, after resist is applied to the entire surface of the structure, the applied resist is patterned to form a resist pattern 17, while being referenced to the gate electrode region 7. With a mask of the resist pattern 17, the third polycrystalline silicon layer is etched. As a result, a conductive film of a third polycrystalline silicon layer 16 is formed covering the surface of the drain region $14_1$ and the surface of the PSG film 10, as best illustrated in FIGS. 3F and 4D. The side walls of the gate electrode portion upstand above the both ends of the drain region and confront with each other, as shown.

As shown in FIG. 3G, a CVD film 18 as a passivation film is deposited over the entire surface of the structure by a reduced pressure CVD method. Then, the arsenic doped in the drain region $14_1$ is thermally diffused therein, to form an $n^+$ region 19 in the drain regions $14_1$ and $14_2$. As a result, in the drain regions $14_1$ and $14_2$, a portion closer to the channel is an $n^-$ region and the remaining portion is an $n^+$ region. In other words, an LDD (lightly doped drain) structure is formed.

Figure 2D:
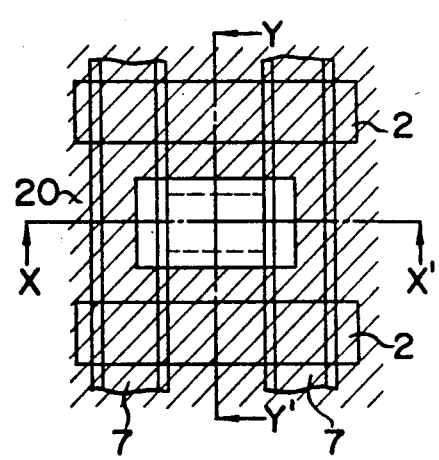

The entire surface of the structure is coated with resist. To form a resist pattern 20, the resist is patterned, with the gate electrode region 7 as a reference, as shown in FIG. 2D. Using the resist pattern 20 as a mask and the third polycrystalline silicon layer 16 as a stopper, the CVD layer 18 is etched as shown in FIGS. 3H and 4E.

Figure 2E:
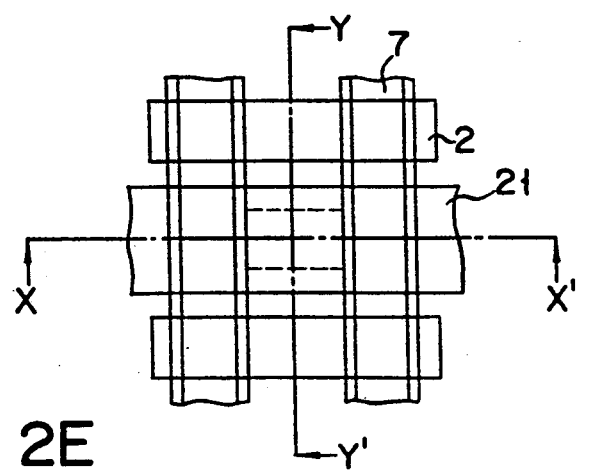

To form an aluminum interconnection layer, for example, aluminum is deposited over the entire surface of the structure by a sputtering method. And then, resist is applied over the entire surface. Referenced to the contact hole pattern (i.e., the etching pattern for the CVD layer 18), the resist is patterned. Using the resist pattern as a mask, the aluminum interconnection layer is etched to form an interconnection pattern 21, as shown in FIGS. 2E, 3I and 4F.

The source contact portion, like the drain contact portion, is also formed by a self aligning contact forming method. Thereafter, an interlayer insulating film and pads are formed on the aluminum interconnection pattern 21 by the ordinary IC manufacturing process, to complete an EPROM integrated circuit.

In the above-mentioned method of manufacturing memory cells, when forming contact holes, the polycrystalline silicon layer 16 is formed the contact area on the silicon substrate and a part of the gate electrode, while the gate electrode is used as a reference for mask alignment. Then, the interlayer insulating film 18 is deposited over the entire surface of the structure. Using the gate electrode for a reference for mask alignment, the interlayer film 18 is selectively etched away. The aluminum layer 21 is finally formed so as to make a contact with the silicon layer 16. This feature relieves the limit for a tolerance of the mask alignment. Therefore, the feature, is advantageous in the microfabrication and integration of semiconductor devices. As recalled, in the conventional memory cell manufacturing method, if a misalignment occurs when the contact holes are formed, a distance from one electrode to the other electrode is reduced, resulting in poor electrical insulation. In the geometrical design of the semiconductor devices, therefore, the interelectrode distance must be selected, allowing for the mask misalignment. This is disadvantageous in improving an integration density of the manufactured devices.

Additionally, before the formation of the third polycrystalline silicon film 16, only the n− region, not the n+ region 19, is formed in the drain regions 14₁ and 14₂. This feature minimizes the phenomenon that an unexpected silicon oxide film is naturally formed between the drain region and the third polycrystalline silicon film 16. A good electrical contact ca be obtained.

After the formation of the third polycrystalline silicon film 16, no movable ions enter the memory cells from exterior. This feature solves the problem of the unreliable read operation due to a variation of the threshold values of the memory cells.

Further, the memory cell manufactured by the present embodiment has the LDD structure with the insulating films on the side walls of the gate electrode portion as the offset region. The structure relieves an intensity of the peak electric field in the vicinity of the drain junction when the memory device including the memory cell is in a read mode.

Furthermore, the n− region in the drain region is so designed that an arsenic concentration in the surface region is higher than that in the remaining portion by two ion-implanting processes of different acceleration voltages. Therefore, the hot electron injection in a write mode is more effective, to prevent increase of the parasitic resistance.

An additional feature of the present embodiment is to use the self alignment for forming the contact portion. The feature allows a large tolerance of the mask alignment, providing an easy microfabrication and integration. As a matter of course, the microfabrication leads to a reduction of the contact sectional area, hence, an increase of the contact resistance. It is noted, however, that the contact sectional area of the present embodiment is larger than that of the memory cell manufactured by the conventional method. Therefore, the increase of the contact resistance is smaller.

A further feature of the present invention resides in that the gate oxide films 3 and 5 are separated from the contact hole portion by the PSG films 10 on the side walls of the gate electrode portion. Because of this feature, the movable ions attached to the contact hole side walls when the contact holes are formed are prevented from entering the cell transistors. In addition to the PSG film 10, the third polycrystalline silicon film 16 converting the side walls of the contact hole contributes to the prevention of the movable ions a major part of which is contained in the aluminum interconnection layer, from entering the cell transistors.

It is noted that the PSG film 10 on the side walls of the gate electrode portion defines the offset region of the n+ region 19 in the LDD structure, prevents the movable ions from entering the memory cell, and insulates the conductive film 16 from the gate electrodes 4 and 6.

Figure 5B:
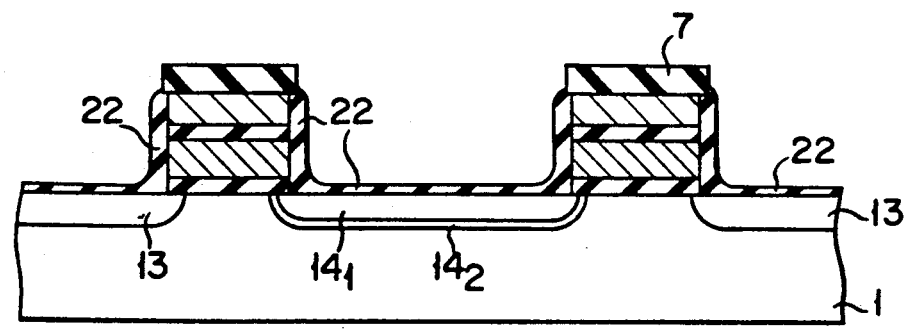

Another embodiment of a semiconductor integrated circuit and a method of manufacturing the same according to the present invention will be described with reference to FIGS. 5A through 5D. Those figures correspond to FIGS. 3A through 3I for the first embodiment. As shown in FIG. 5A, a field oxide film (not shown) is formed on the surface of a p-type polycrystalline silicon substrate 1, to define element formed areas, and to form transistor regions and gate electrode regions. Then, arsenic and phosphorus are ion implanted into the source regions and the drain regions. The manufacturing process up to this step is the same as that up to the step of FIG. 3B in the first embodiment. Like symbols are used for designating like or equivalent portions in FIGS. 3A and 3B.

Figure 5C:
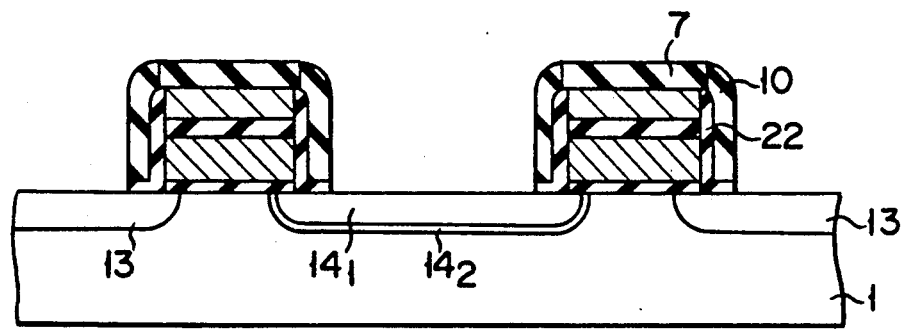

After removing the resist 9, the structure is subjected to the thermal oxidizing process, forming a silicon oxide film 22 of approximately 350 Angstroms thick on the side walls of the electrode portion. At this time, the silicon oxide film 22 is formed, approximately 200 Angstroms, also on the substrate surface. In this process, the arsenic and phosphorous ions are diffused so that an n+ region is formed in a source region 13, and an double n− region is formed in a drain region 14. Phosphorus, for example, is doped into the structure through its entire surface under the condition of 20 keV of acceleration voltage and $5 \times 10^{14}$ cm$^{-2}$ of dosage. Succeedingly, a PSG film 10 is layered over the entire surface of the structure, as shown in FIG. 5C. Further, the RIE process is applied to the structure, to selectively etch away the upper surface of the PSG film 10 and the oxide film 22 on the substrate 1. In the etching process, the PSG film on the side walls 10 of the gate electrode portion is left.

Figure 5D:
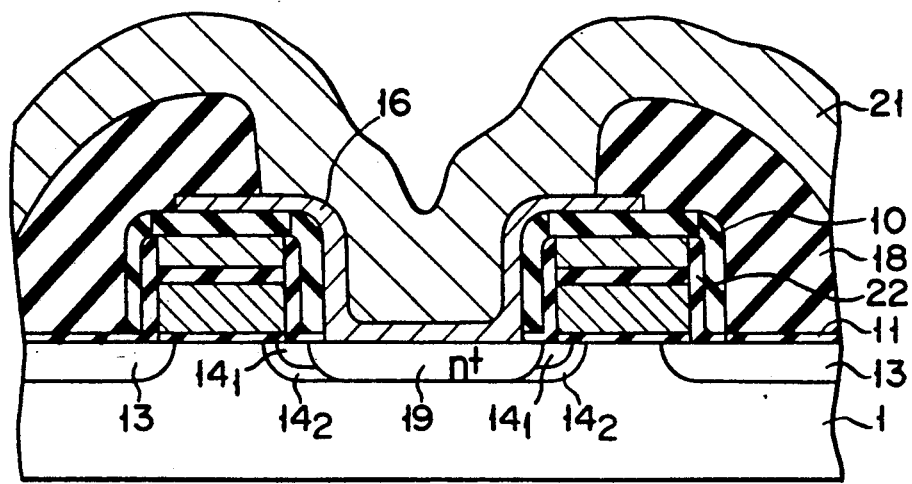

Thereafter, as shown in FIG. 5D, the thermal oxide film 11 is formed on the surface of the source region 13 by thermal oxidization process. Further, a conductive film 16 is formed to cover the drain region surface and the PSG film layered side walls 10 continuous to the former. Then, an n+ region 19 in the drain region, interlayer insulating film 18, aluminum interconnection film 21, and the like are successively formed through similar process steps in the first embodiment, to complete an EPROM.

It is noted that in the memory cell shown in FIG. 5D, the side walls of the cell transistor are covered with the silicon oxide film 22.

The silicon oxide film 22, which exists between the PSG side walls 10 and the substrate 1, contains much phosphorus, because it is doped with ion after the silicon oxide film 22. Accordingly, also in the embodiment, it is possible to prevent movable ions from entering the memory cell. Additionally, in the present embodiment, after the cell transistor is formed, the thermal oxidization process is used for forming the silicon oxide film 22. This feature reduces a leakage of charges from the floating gate 4 and the control gate 6, improving the breakdown performance.

It is evident that the present invention, which has been applied to the EPROM in the above-mentioned embodiments, may also be applied to EEPROMs, and memory IC devices and hybrid memory IC devices which use nonvolatile memory cells based on the floating gate type transistors.

In the above-mentioned embodiments, the impurity doping follows the formation of the third polycrystalline silicon film 16 over the entire surface of the substrate. If required, the formation of the polycrystalline silicon film 16 and the impurity doping may be concurrently performed.

As seen from the foregoing description, according to the semiconductor integrated circuit of the present invention, it is allowed to reduce a tolerance of the pattern alignment of the gate electrodes of the cell transistor with the contact hole. This enhances the microfabrication technique. Further, the semiconductor devices according to the present invention are free from the problems essential to the prior art, such as entering of movable ions into the cells, variations of the cell threshold value, occurrence of soft error, and degradation of reliability of the data read operation.

According to a method of manufacturing the semiconductor integrated circuit, it is allowed to reduce a tolerance of the pattern alignment of the gate electrodes of the cell transistor with the drain contact hole. An improved microfabrication is realized. Further, it is possible to minimize the oxide film which is naturally grown on the bottom surface of the contact hole. The increase of the contact resistance is also minimized. Furthermore, it is possible to prevent the movable ions from entering the memory cells during the manufacturing of the IC circuits. The resulting memory cells are free from degradation of their reliability.

What is claimed is:

1. A semiconductor integrated circuit having memory cells constructed with floating gate type MOS transistors formed on a semiconductor substrate, comprising:
    a semiconductor substrate;
    adjacent laminated gate electrodes of adjacent floating gate type MOS transistors, each including a floating gate electrode and a control gate electrode formed on said semiconductor substrate;
    a first insulating film having a first portion and a second portion formed on a top surface and a side wall of each of said adjacent laminated gate electrodes, respectively, the second portion of the first insulating film being provided by patterning and made of silicate glass containing phosphorus;
    an insulating film formed over the semiconductor substrate to provide between said adjacent laminated gate electrodes a contact hole which leads to a portion of said semiconductor substrate in which a drain region is to be formed, said contact hole being between said adjacent laminated gate electrodes, defined by said second portion of said first insulating film of each adjacent laminated gate electrode;
    a conductive film covering said portion of said semiconductor substrate and said first and second portions of said first insulating films;
    source regions and a drain region formed in said semiconductor substrate in self alignment with said adjacent laminated gate electrodes, said drain region being common with said adjacent floating gate type MOS transistors, wherein said second portion of said first insulating film serves as an offset of said drain region, so that an impurity concentration of a first portion of said drain region adjacent to a channel region of one of said MOS transistors is lower than that in a second portion of said drain region;
    a second insulating film formed on said conductive film, having a contact hole formed by an etching process using said conductive film as a stopper film; and
    a metal interconnection pattern formed on said conductive film via said contact hole of the second insulating film.

2. A semiconductor integrated circuit having memory cells constructed with floating gate type MOS transistors formed on a semiconductor substrate, comprising:
    a semiconductor substrate;
    adjacent laminated gate electrodes of adjacent floating gate type MOS transistors, each including a floating gate electrode and a control gate electrode formed on said semiconductor substrate;
    a first insulating film having a first portion and a second portion formed on a top surface and side wall of each of said adjacent laminated gate electrodes, respectively, the second portion of the first insulating film being provided by patterning and having a laminated structure containing a thermal oxide film and a silicate glass containing phosphorus;
    an insulating film formed over the semiconductor substrate to provide between said adjacent laminated gate electrodes a contact hole which leads to a portion of said semiconductor substrate in which a drain region is to be formed, said contact hole being between said adjacent laminated gate electrodes, defined by said second portion of said first insulating film of each adjacent laminated gate electrode;
    a conductive film covering said portion of said semiconductor substrate and said first and second portions of said first insulating films;
    source regions and a drain region formed in said semiconductor substrate in self alignment with said adjacent laminated gate electrodes, said drain region being common with said adjacent floating gate type MOS transistors, wherein said second portion of said first insulating film serves as an offset of said drain region, so that an impurity concentration of a first portion of said drain region adjacent to a channel region of one of said MOS transistors is lower than that in a second portion of said drain regions;
    a second insulating film formed on said conductive film, having a contact hole formed by an etching process using said conductive film as a stopper film; and
    a metal interconnection pattern formed on said conductive film via said contact hole of the second insulating film.

3. The semiconductor integrated circuit according to claim 1, further comprising a third insulating film formed between said side wall of said laminated gate electrode and said second portion of said first insulating film, and between said second portion of said first insulating film and said semiconductor substrate.

* * * * *

UNITED STATES PATENT AND TRADEMARK OFFICE
CERTIFICATE OF CORRECTION

PATENT NO. : 5,194,929
DATED : March 16, 1993
INVENTOR(S) : Yoichi Ohshima, et. al.

It is certified that error appears in the above-indentified patent and that said Letters Patent is hereby corrected as shown below:

On the Title page, item [54] and col. 1, line 2, change "MEMORY" (second occurrence) to --METHOD--.

On the Title page, item [57] Abstract, line 18, col. 2, change "fomred" to --formed--.

Column 9, Claim 1, line 59, change "films" to --film--.

Column 10, Claim 2, line 41, change "films" to --film--.

Signed and Sealed this

Fifteenth Day of March, 1994

Attest:

BRUCE LEHMAN

Attesting Officer        Commissioner of Patents and Trademarks